United States Patent
Chuang et al.

(10) Patent No.: US 10,558,123 B2
(45) Date of Patent: *Feb. 11, 2020

(54) ELECTRON SOURCE

(71) Applicant: KLA-Tencor Corporation, Milpitas, CA (US)

(72) Inventors: Yung-Ho Alex Chuang, Cupertino, CA (US); Yinying Xiao-Li, San Jose, CA (US); Xuefeng Liu, San Jose, CA (US); John Fielden, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/161,010

(22) Filed: Oct. 15, 2018

(65) Prior Publication Data
US 2019/0049851 A1    Feb. 14, 2019

Related U.S. Application Data

(63) Continuation of application No. 15/234,638, filed on Aug. 11, 2016, now Pat. No. 10,133,181.
(Continued)

(51) Int. Cl.
*H01J 37/073* (2006.01)
*G03F 7/20* (2006.01)
(Continued)

(52) U.S. Cl.
CPC .......... *G03F 7/70008* (2013.01); *H01J 1/304* (2013.01); *H01J 1/34* (2013.01);
(Continued)

(58) Field of Classification Search
CPC ...... H01J 27/26; H01J 27/14831; H01J 37/08; H01J 37/226; H01J 1/34; H01J 1/308; H01J 1/3044
See application file for complete search history.

(56) References Cited

U.S. PATENT DOCUMENTS

| 4,631,448 A | 12/1986 | Tamura et al. |
| 5,363,021 A | 11/1994 | MacDonald |

(Continued)

FOREIGN PATENT DOCUMENTS

| JP | 2005310724 | 11/2005 |
| TW | 200739642 A | 10/2007 |

(Continued)

OTHER PUBLICATIONS

Search Report for TW105125826, TIPO, dated Oct. 18, 2019.

*Primary Examiner* — David E Smith
*Assistant Examiner* — Hsien C Tsai
(74) *Attorney, Agent, or Firm* — Hodgson Russ LLP

(57) ABSTRACT

An electron source is formed on a silicon substrate having opposing first and second surfaces. At least one field emitter is prepared on the second surface of the silicon substrate to enhance the emission of electrons. To prevent oxidation of the silicon, a thin, contiguous boron layer is disposed directly on the output surface of the field emitter using a process that minimizes oxidation and defects. The field emitter can take various shapes such as pyramids and rounded whiskers. One or several optional gate layers may be placed at or slightly lower than the height of the field emitter tip in order to achieve fast and accurate control of the emission current and high emission currents. The field emitter can be p-type doped and configured to operate in a reverse bias mode or the field emitter can be n-type doped.

19 Claims, 7 Drawing Sheets

Related U.S. Application Data

(60) Provisional application No. 62/205,287, filed on Aug. 14, 2015.

(51) Int. Cl.
*H01J 1/34* (2006.01)
*H01J 1/304* (2006.01)
*H01J 35/06* (2006.01)

(52) U.S. Cl.
CPC ........... *H01J 37/073* (2013.01); *H01J 35/065* (2013.01); *H01J 2201/3048* (2013.01); *H01J 2201/30411* (2013.01); *H01J 2237/0635* (2013.01)

(56) References Cited

U.S. PATENT DOCUMENTS

| | | | | |
|---|---|---|---|---|
| 5,382,867 A * | 1/1995 | Yuji | ........................ | H01J 1/30 313/309 |
| 10,133,181 B2 * | 11/2018 | Chuang | .................... | H01J 1/304 |
| 2014/0034816 A1 * | 2/2014 | Chuang | ................. | H01J 29/385 250/216 |

FOREIGN PATENT DOCUMENTS

| TW | 200849306 A | 12/2008 |
|---|---|---|
| WO | 2008127393 A2 | 10/2008 |

* cited by examiner

ELECTRON SOURCE

CROSS-REFERENCE TO RELATED APPLICATIONS

This application is a continuation of the patent application filed Aug. 11, 2016, and assigned U.S. application Ser. No. 15/234,638, which claims priority to the provisional patent application, filed Aug. 14, 2015 and assigned U.S. App. No. 62/205,287, the disclosures of each of which are hereby incorporated herein by reference.

FIELD OF THE DISCLOSURE

The disclosure relates generally to electron sources suitable for use in scanning electron microscopes and systems for reviewing and inspecting samples. In particular, the disclosure relates to electron field emitters suitable for use in review and inspection systems, including those used to review and/or inspect photomasks, reticles, and semiconductor wafers.

BACKGROUND OF THE DISCLOSURE

The integrated circuit industry requires inspection tools with increasingly higher sensitivity to detect ever smaller defects and particles whose sizes may be a few tens of nanometers (nm), or less. These inspection tools must operate at high speed in order to inspect a large fraction, or even 100%, of the area of a photomask, reticle, or wafer, in a short period of time. For example, inspection time may be one hour or less for inspection during production or, at most, a few hours for R&D or troubleshooting. In order to inspect so quickly, inspection tools use pixel or spot sizes larger than the dimensions of the defect or particle of interest, and detect just a small change in signal caused by a defect or particle. High speed inspection is most commonly performed in production using inspection tools operating with UV light. Inspection in R&D may be performed with UV light or with electrons.

Once a defect or particle has been found by high speed inspection, it is often necessary to make a higher resolution image and/or to perform material analysis to determine the origin or type of the particle or defect. This process is commonly called review. Review is usually performed with a scanning electron microscope (SEM). Review SEMs used in semiconductor manufacturing are typically required to review many thousands of potential defects or particles per day and may have, at most, a few seconds per target for review.

Electron microscopes need an electron source to generate an electron beam directed toward a sample. Electron sources can be divided into two broad groups: thermionic sources and field emission sources. Thermionic sources are the most common commercially available electron emitters, and are usually made of tungsten or lanthanum hexaboride ($LaB_6$). In thermionic emission, electrons are boiled off the material surface when the electron thermal energy is high enough to overcome the surface potential barrier. Thermionic emitters typically require elevated temperatures (>1300 K) to operate, and have several drawbacks such as inefficient power consumption, wide energy spread, short lifetime, low current density, and limited brightness. The demand for more efficient electron sources has driven the research and development of Schottky emitters and cold electron sources such as electron field emitters.

In the Schottky emitters, thermionic emission is enhanced by effective potential barrier lowering due to the image charge effect under an applied external electric field. Schottky emitters are typically made of a tungsten wire having a tip coated with a layer of zirconium oxide ($ZrO_x$), which exhibits a much lower work function (~2.9 eV). Thermally-assisted Schottky emitters need to be operated at high temperature (>1000 K) and high vacuum (~$10^{-9}$ mbar), and have wider than desirable electron emission energy spread due to the high operating temperature. An electron source with lower energy spread, higher brightness (radiance), and higher current density than Schottky emitters is desirable for semiconductor wafer and mask inspection, review, and lithography as it will enable faster and more cost effective inspection, review, and lithography.

Cold electron sources, particularly electron field emitters, have been used in field emission displays, gas ionizers, x-ray sources, electron-beam lithography, and electron microscopes, among other applications. Field emission takes place when the applied electric field is high enough to reduce the potential barrier on the tip-vacuum interface so that electrons can tunnel through this barrier at a temperature close to room temperature (i.e., quantum-mechanical tunneling). A typical field-emitter consists of a conical emitter tip with a circular gate aperture. A potential difference is established across the emitter cathode, gate, and anode under an applied external field, resulting in high electric field at the surface of the tip. Electrons tunnel through the narrow surface barrier and travel toward an anode, which is biased at a more positive potential than the gate. The emission current density can be estimated by a modified version of the Fowler-Nordheim theory, which takes into account the field enhancement factor due to the field emitters.

Field emitters, because they can operate near room temperature, have lower energy spread than Schottky and thermionic emitters, and can have higher brightness and electron current than thermionic emitters. However, in practical use, the output current of a field emitter is less stable as contaminants can easily stick to the tip of the emitter and raise its work function, which will lower the brightness and current. Periodic flashing (i.e., temporarily raising the tip temperature) is required to remove those contaminants. The instrument is not available for operation while the tip is being flashed. In the semiconductor industry, instruments are required to operate continuously and stably without interruption for long periods, so Schottky emitters are usually used in preference to cold field emitters.

Early efforts have been concentrated on developing metallic field emitters. Among others, Spindt-type molybdenum field emitters are perhaps the most well-known metallic field emitters because molybdenum has a low resistivity (53.4 n$\Omega$·m at 20° C.) and a high melting point (2896 K). Nevertheless, metallic emitters suffer from several disadvantages such as lack of uniformity due to metal deposition techniques, and, more severely, the degradation in emission current, mainly due to oxidation.

With the advent of modern semiconductor fabrication technology, there has been investigation of semiconductor field emitters, particularly silicon field emitters. Single-crystal (monocrystalline) silicon is an attractive material for field emitters. Silicon crystals can be grown with very high purity and very few crystal defects. The conductivity of silicon can be altered by doping and/or applying a voltage. More importantly, silicon has a well-developed technology base.

The structure of a typical prior-art silicon field emitter is shown in FIG. 6. A silicon substrate 61 is doped with impurities and can be either n-type or p-type doped. The cone-shaped emitter 64 is formed on the silicon substrate 61, with an optional gate layer 67 attached to a dielectric layer 66, which includes one or more insulating layers. The optional gate layer 67 controls and extracts the emission current. A third electrode (i.e., the anode (not shown)), faces the gate layer 67 and is separated at a large distance, on the order of hundreds of microns, from the cathode. This is the typical silicon field emitter triode configuration. Note that without the gate layer 67, the field emitter can be used as a diode. Quantum tunneling of electrons takes place when a bias voltage is applied across the emitter structure. A large electrical field is generated on the surface of the emitter tip, and electrons are emitted from the tip.

Even though silicon field emitters have shown promise in recent years, they are not yet commercially available. One serious problem with the use of silicon to form field emitters is that silicon is quite reactive, and can be contaminated within hours, even at pressures around $10^{-10}$ torr. Silicon very readily forms a native oxide on its surface. Even in a vacuum, a native oxide will eventually form as the small amounts of oxygen and water present in the vacuum will react with the surface of the silicon. The interface between silicon and silicon dioxide has defects (due to dangling bonds) where the probability of an electron recombination is very high. Furthermore, the band gap of silicon dioxide is large (about 9 eV) creating an additional barrier higher than the work function that an electron has to overcome in order to escape, even if the oxide is very thin. For example, native oxide on a very smooth silicon surface is typically about 2 nm thick. In some circumstances, oxidation can also change the shape of the field emitters. These aforementioned problems may result in low brightness and current as well as poor stability of emission, the lack of reliability, scalability and uniformity, and have hindered the commercial use of silicon field emitters.

Research effort has been expanded in looking for surface treatments and coatings for field emitters to improve their performance for lower turn-on voltages, higher emission current densities, lower noise, and improved stability. These treatments may include coating the emitter tips with refractory metals, silicides, carbides, and diamond, etc. However, these coating materials are usually limited by the fabrication process in forming smooth and uniform coating surfaces, and/or are often affected by the oxide layer formed on the coating surfaces, creating an additional energy barrier. For these reasons, coated silicon field emitters have not become yet practical as cold electron sources.

What is therefore needed is an electron source that overcomes some, or all, of the limitations of the prior art.

SUMMARY OF THE DISCLOSURE

In a first embodiment, an electron source is provided. The electron source comprises a silicon substrate having a top surface; at least one field emitter formed directly on the top surface of the silicon substrate; and a boron layer hermetically disposed on at least a tip of the field emitter. The field emitter comprises a pyramid or a rounded whisker. The boron layer is greater than 90% boron.

The boron layer can comprise less than 10% oxygen near an interface between the boron layer and the silicon substrate.

The tip of the field emitter can have a lateral dimension less than 100 nm. The tip of the field emitter can have a lateral dimension greater than 20 nm. The tip of the field emitter can have a diameter less than 100 nm.

The electron source may further comprise an electrode held at a positive voltage of at least 500 V relative to the field emitter at a distance of at least 50 µm from the field emitter. The field emitter can be configured to operate in a reverse bias mode in which a depletion layer is generated by an electric field at a surface of the field emitter.

The electron source may further comprise an electrode held at a positive voltage of less than 500 V relative to the field emitter at a distance of 2 µm or less from an apex of the field emitter. The field emitter can be configured to operate in a reverse bias mode in which a depletion layer is generated by an electric field at an emitter surface of the field emitter.

The field emitter can be p-type doped with a doping level less than about $10^{19}$ cm$^{-3}$.

The field emitter can be p-type doped with a doping level less than about $10^{14}$ cm$^{-3}$.

The electron source may further comprise a light source that illuminates the field emitter. The light source can comprise one of a laser diode and a light emitting diode. The light source may be configured to maintain a desired emission current from the field emitter.

The field emitter can be n-type doped with a doping level between about $10^{16}$ cm$^{-3}$ and about $10^{19}$ cm$^{-3}$.

The boron layer can have a thickness from 2 nm to 6 nm.

The electron source may further comprise a dielectric layer disposed on the top surface adjacent to the field emitter and a conductive gate disposed on the dielectric layer opposite of the substrate. The thickness of the dielectric layer can be approximately equal to or less than a height of the field emitter.

The electron source may further comprise a plurality of the field emitters arranged in a two-dimensional periodic pattern. The electron source may further comprise a dielectric layer disposed on the top surface surrounding the plurality of field emitters and a conductive gate disposed on the dielectric layer opposite of the substrate. The thickness of the dielectric layer can be approximately equal to or less than a height of a field emitter.

In a second embodiment, a device is provided. The device comprises an electron source for generating a primary electron beam that is directed toward a sample and electron optics. The electron source comprises: a silicon substrate having a top surface; at least one field emitter formed directly on the top surface of the silicon substrate; and a boron layer disposed on the field emitter. The field emitter comprises a pyramid or a rounded whisker. The boron layer is greater than 90% boron.

The device may be a scanning electron microscope (SEM) in which the electron optics are configured to de-magnify and focus the primary electron beam onto the sample. The device can further comprise a detector for detecting at least one of back-scattered electrons and secondary electrons from the sample.

The electron source may further comprise: a dielectric layer disposed on the top surface adjacent to the field emitter and a conductive gate disposed on the dielectric layer opposite of the substrate. The thickness of the dielectric layer can be approximately equal to or less than a height of the field emitter.

The electron source may further comprise a light source configured to control the current of the primary electron beam.

The device may be an electron-beam lithography system in which the electron optics are configured to de-magnify and focus the primary electron beam onto the target. The device may further comprise a modulator for modulating the intensity of the electron beam.

The device may be an X-ray source in which the electron optics are configured to direct the primary electron beam to the anode.

BRIEF DESCRIPTION OF THE DRAWINGS

The present disclosure is illustrated by way of example, and not by way of limitation, in the figures of the accompanying drawings in which.

DETAILED DESCRIPTION OF THE DISCLOSURE

Figure 1:
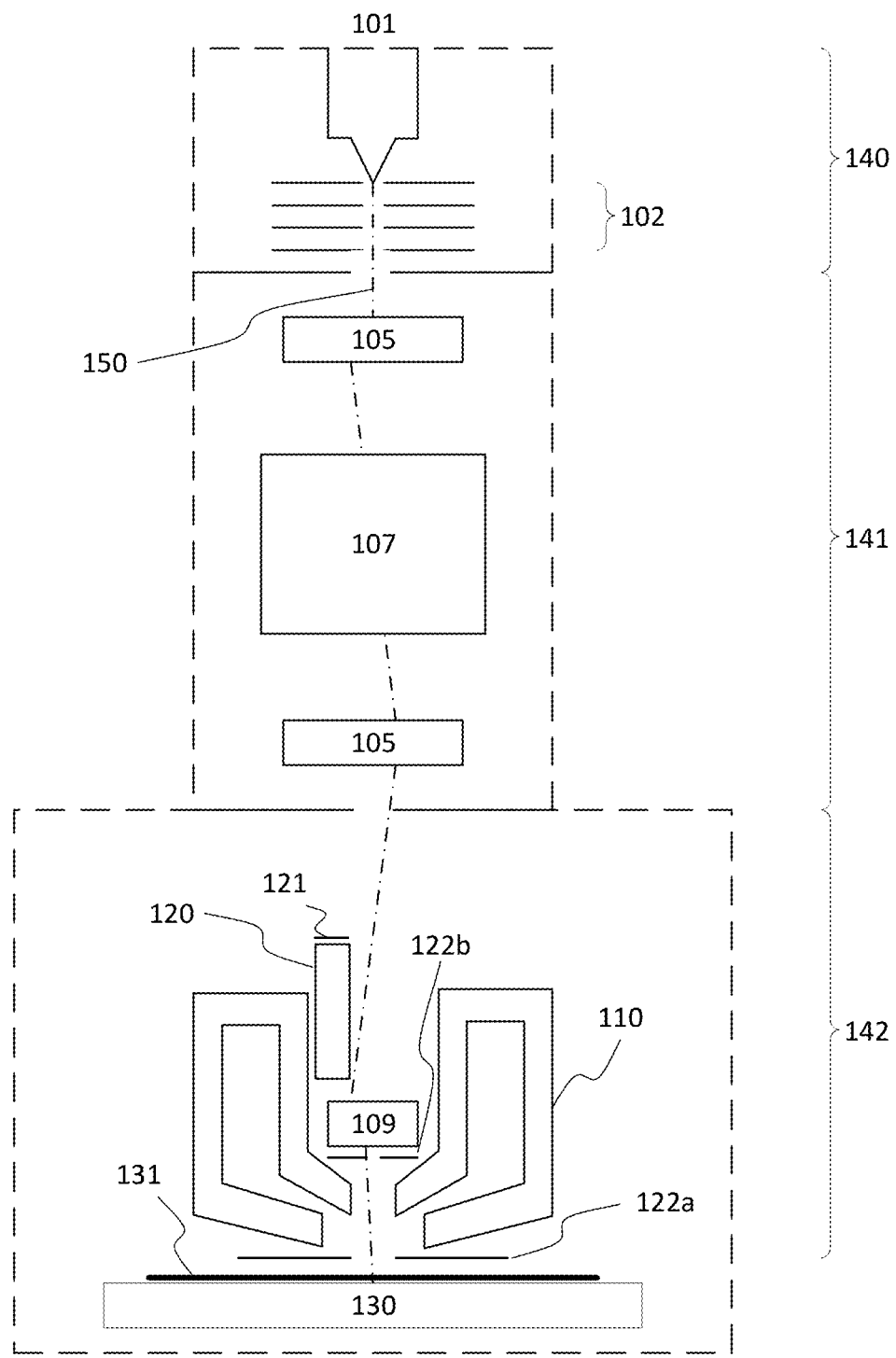
FIG. 1 illustrates an exemplary SEM incorporating an embodiment of an electron source, electron optics, a backscattered electron detector, and a secondary electron detector in accordance with the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The following description is presented to enable one of ordinary skill in the art to make and use the disclosure as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

The present disclosure relates to an improvement in electron sources for semiconductor inspection, metrology, and review systems. The electron source, in a diode configuration, can include a field emitter cathode and an anode facing the cathode. The field emitter is formed on a silicon substrate and a boron (first) layer is formed on at least the output surface of the field emitter. The silicon substrate can be essentially defect-free monocrystalline (single-crystal) silicon having a thickness in the range of about 10 nm to about 100 μm. The boron layer can be formed using a high temperature deposition process (e.g., between about 600° C. and 800° C.) on clean silicon in a manner that produces a pin-hole free, contiguous, substantially pure boron layer having a thickness in the range of 2-5 nm (e.g., about 2 to 4 nm) including all ranges and values to the 0.1 nm therebetween. The boron layer circumvents silicon's oxidation problem by reliably and hermetically sealing the silicon surface against oxidation. Note that a few atomic percent of oxygen (such as less than 10% or less than 5%) may remain at the interface between the boron layer and the surface of the silicon, but that oxygen content likely will not significantly increase over time (such as over a time period of one year) because of the hermetic sealing. Such a low oxygen to silicon ratio means that there is no contiguous silicon dioxide layer at the interface, so that electrons are easily able to leave the silicon surface through the boron layer. The field emitter can be fabricated by standard CMOS fabrication techniques. Silicon dioxide or silicon nitride can be used as mask material deposited by PECVD, and photolithography can be used for patterning. Dry etching (such as RIE, ICP and ECR), wet etching, or a combination of dry and wet etching can be used to form the field emitter, which can take various shapes, such as rounded whiskers (cylindrical posts with round tips), rounded cones, or pyramids. The field emitter circumvents silicon's relatively high work function by taking advantage of the field enhancement due to the field emitter. A second electrode (i.e., the anode) is positioned facing the field emitter cathode. The anode is usually made of metals such as tungsten, molybdenum, and stainless steel among others. A high voltage source, typically on the order of kilovolts, is utilized to generate an external potential difference between the field emitter and the anode in order to create a strong electric field near the tip of the field emitter causing electrons to preferentially move toward the emitter tip. When a high potential difference between the field emitter and anode (such as a voltage of about 1 kV or higher) is used, the anode should preferably be about 50 μm away from the field emitter. In an embodiment, the anode is placed at least 50 μm from the emitter tip, at a positive voltage of at least 500 V relative to the field emitter. In an alternative embodiment, the anode is placed close to the emitter tip, such as a distance of about 2 μm or less, at a potential of less than 500 V positive to the emitter. Placing the anode closer to the emitter tip allows a sufficiently strong electric field to be generated from a smaller voltage, which has the advantage of minimizing back-bombardment of the emitter by highly energetic ions that can reduce the lifetime of the emitter. However placing the anode closer to the emitter tip requires more precise alignment of the aperture in the anode to the emitter tip.

Field emission takes place when the applied electric field is high enough to reduce the potential barrier on the silicon-vacuum interface so that the electron can tunnel through this barrier (i.e., quantum-mechanical tunneling). In a semiconductor, where the electron concentration is determined by the local doping level and potential, it is possible to configure the field emitters to be operated in reverse bias mode as in a p-n diode, in which a depletion layer is generated due to the high electric field at the emitter surface. The interface between vacuum and a boron-coated, p-type doped field emitter can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of the emitter tip, and an electric current, on the order of nA to µA is produced. In an alternative embodiment, the electric field may be kept at a slightly lower level so that the bottom of the conduction band stays just above the Fermi level and little or no emission current is generated. In this embodiment, light may be used to create electron-hole pairs. The electrons so created will be strongly attracted towards the tip and many will be emitted from the tip as an emission current. In this embodiment, the emission current may be controlled by controlling the light level incident on, or near, the field emitter. In yet another embodiment, the bulk of the silicon wafer may be n-type doped, so that an abundance of electrons are available to form the emission current. The emission current density can be estimated by a modified version of the Fowler-Nordheim theory, which takes into account the field enhancement factor due to the field emitter. Thus, by producing an electron emitter structure having both a boron layer and a field emitter formed on the single-crystal silicon substrate, the present disclosure provides the beneficial qualities of silicon (i.e., high purity/low defect material, long electron recombination times, and mature silicon-based fabrication process), and enables the enticing features of field emitters (i.e., small emitter size, low power consumption, high brightness, high current density, high speed, and long emitter lifetime), while avoiding the negative aspects that have previously prevented the widespread commercial use of silicon-based field emitter structures.

According to various alternative embodiments of the present disclosure, various additional layers and structures are utilized to further enhance the beneficial qualities of the disclosed emitter structure. In some embodiments, one or several gate layers, or control electrodes, are placed at, or slightly lower than, the height of the field emitter tip in order to further enhance the electric field at the emitter tip, and achieve fast and accurate control of the emission current. The gate layer is typically formed on top of one or several insulating layers deposited on the substrate. If there are several gate layers, the insulating layers are the spacers in between these gate layers. In yet other embodiments, multi electron-beam sources comprise a plurality of the disclosed field emitters arranged in a two-dimensional periodic pattern (e.g., a field emitter array (FEA)) disposed on the emitter surface for emitting electrons in the presence of an electric field.

In accordance with embodiments of the present disclosure, the electron sources disclosed herein are incorporated into inspection, metrology, and review scanning electron microscopes (SEMs). An SEM typically includes an electron source, electron optics, and a detector. The electron optics can be configured to de-magnify and focus the primary electron beam onto the sample and the detector can be configured to detect at least one of back-scattered electrons and secondary electrons from the sample. The electron source generates a primary electron beam that is directed toward a sample. The disclosed boron-coated silicon field emitter, in a diode or a triode configuration, as well as a plurality of the disclosed emitters can be utilized as the electron source in the scanning electron microscope. The electron optics de-magnifies and focuses the primary electron beam onto the sample. The electron optics also include deflectors that can scan the primary electron beam across an area of the sample. When the primary electron beam strikes the sample, the sample absorbs many of the electrons from the primary electron beam, but scatters some of the electrons (back-scattered electrons). The absorbed energy causes secondary electrons to be emitted from the sample along with X-rays and Auger electrons. The secondary electrons are collected by a secondary electron detector. The back-scattered electrons may be collected by a back-scattered electron detector.

FIG. 1 illustrates an exemplary inspection, metrology, or review scanning electron microscope system 100 configured to inspect or review a sample 131 such as a semiconductor wafer, reticle, or photomask. The SEM typically includes an electron source, electron optics, and a detector. In FIG. 1, an electron column comprising an electron gun (or electron source) 140, an upper column 141, and a lower column 142 focuses and directs a primary electron beam 150 to the sample 131. The electron gun 140 can incorporate the disclosed boron-coated silicon field emitter in the diode or the triode configuration. Electrons are emitted from a field emitter cathode 101, and travel through extraction and focusing electrodes 102 (which may include an anode), and form a primary electron beam 150 with a desired beam energy and beam current, usually on the order of nA to µA. Electron gun 140 may further comprise a magnetic lens (not shown). Upper column 141 includes one or more condenser lenses 107 that de-magnify the primary electron beam 150 to create a small spot on the sample 131. One or more deflectors 105 may be placed on either side of condenser lens 107. Lower column 142 includes a final lens 110 for focusing the primary electron beam 150 to a small spot on the sample 131. Lower column 142 also includes one or more deflectors 109 that work in combination with deflectors 105 (if present) to scan the primary electron beam across an area of the sample 131. Sample 131 is placed on a stage 130 in order to facilitate movement of different regions of sample 131 underneath the electron column. Secondary electrons and back-scattered electrons are emitted from the sample 131 when the primary electron beam 150 hits it. Secondary electrons may be collected and accelerated by electrodes 120 and directed to secondary electron detector 121. Back-scattered electrons may be detected by a back-scattered electron detector such as those shown at 122a and 122b.

While disclosed in an SEM, the electron sources disclosed herein also can be incorporated into, for example, an electron-beam lithography system or an X-ray source. The electron-beam lithography system can include electron optics that are configured to de-magnify and focus the primary electron beam onto the target and a modulator for modulating the intensity of the electron beam. The X-ray source can include electron optics configured to direct the electron beam to the anode.

Figure 2A:
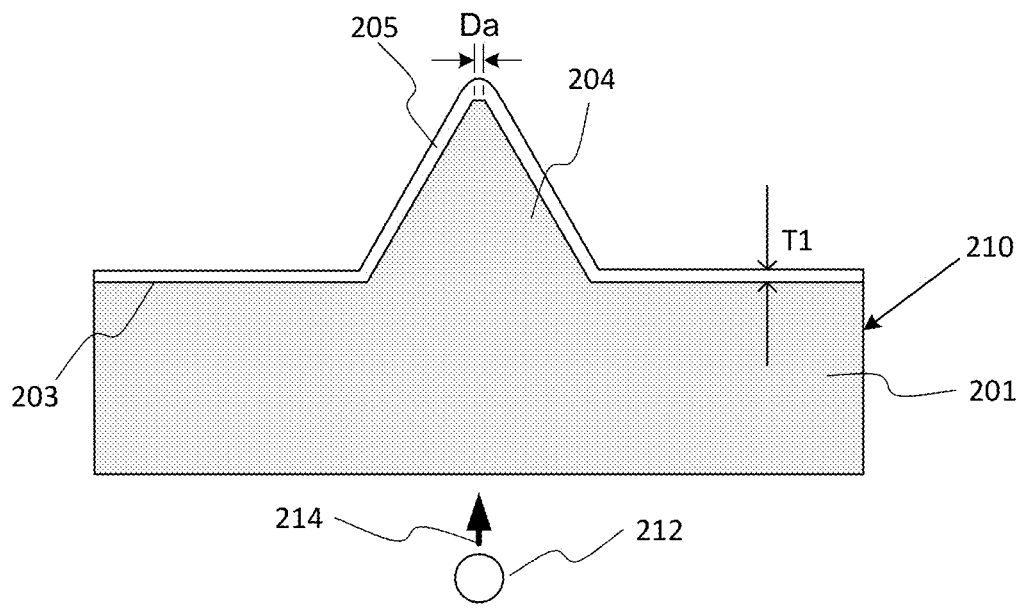
FIGS. 2(A) and 2(B) are cross-sectional side views illustrating electron sources in a diode configuration including a boron-coated silicon field emitter formed on a silicon substrate according to exemplary embodiments of the present disclosure.

FIG. 2(A) illustrates, in cross section view, an electron source 200a according to an exemplary embodiment of the present disclosure. Electron source 200a generally includes a field emitter cathode 210 and an anode (not shown) facing the cathode 210. The anode may be separated by a distance between about one micron and a few hundred microns from the cathode 210. In the field emitter cathode 210 is a silicon substrate 201 having an upward-facing output (top) surface 203 with a field emitter 204 disposed on output surface 203 and a substantially pure, contiguous boron layer 205 disposed on the output surface 203 covering the field emitter 204. The field emitter 204 shown in this figure has a pyramidal shape that can be made by anisotropic etching, which may have a slope angle close to 54.7° since that angle corresponds to the intersection of the (100) and (111) planes in monocrystalline silicon. Oxidation sharpening, which may be performed at a low to moderate temperature (less than about 950° C.), may be used prior to depositing boron layer 205 when sharp field emitter tips are desired. The apex of the sharpened tip may comprise, at atomic scale lengths, a substantially flat area, such as a surface substantially parallel to a crystal plane of the silicon crystal, for example substantially parallel to a (100) plane. In FIG. 2(A) a characteristic lateral dimension, such as a diameter, of the sharpened region is indicated by Da. In a preferred embodiment Da may be between about 1 nm and about 100 nm. For example, Da may be less than about 100 nm or less than about 20 nm. A second electrode (i.e., the anode (not shown)), is positioned facing the field emitter cathode 210. The anode may be made of metals such as tungsten, molybdenum, and stainless steel among others. A voltage source is utilized to generate an external potential difference between the cathode and the anode in order to cause electrons to preferentially move toward the tip of field emitter 204. Electron source 200a operates similarly to a typical cold electron source in that, when a strong electric field (such as a field between about 100 V $\mu m^{-1}$ and about 10 kV $\mu m^{-1}$) is applied to the tip, electrons have a high probability of being emitted from substrate 201 through the output surface 203 of the field emitter 204, most often from near the tip of the field emitter 204. As explained above, the boron layer 205 on the tip hermetically seals the tip against oxidation. To ensure that the boron layer 205 provides a good hermetic seal without forming a strong barrier to electron emission, the thickness T1 of the boron layer 205 may be between about 2 nm and 6 nm. Even if a few percent of oxygen remains at the interface between silicon and boron, no more oxygen can penetrate and no significant further oxidation occurs. Since the electron emission occurs from a small region near the apex of the emitter, such as the area with a lateral dimension Da shown in FIG. 2(A), the quality of the boron layer 205 in this region may be most important. A few pinholes or gaps in the coverage of the boron layer 205 more than a few hundred nm away from this emission region will typically not affect the emission and can be tolerated.

By a substantially pure boron layer, the majority of the layer is elemental boron. Some impurities, such as silicon or carbon may be present either on the surface or in the lattice. For example, a boron silicide may be present at the interface between the boron layer 205 and the substrate 201. Oxygen may be present in the bulk of the layer, but not in an easily detectable amount. Thus, the layer can comprise, consist of, or consist essentially of boron. The boron layer 205 may be greater than 75%, greater than 80%, greater than 85%, greater than 90%, greater than 95%, greater than 96%, greater than 97%, greater than 98%, or greater than 99% boron.

By a contiguous boron layer, the boron layer 205 is unbroken across part of the output surface 203. The output surface may be just the surface of the field emitter 204 or may be a larger area on the output surface 203 that at least includes the field emitter 204. The majority of the electron emission from field emitter 204 may be from a region of tens of nm in radius in an instance, and this radius may be covered by the boron layer 205 in an unbroken manner.

The boron layer 205 may be, for example, 5 nm thick or may be 20 to 25 atomic layers of boron. The boron layer 205 may have a uniform thickness or may deposit differently on the field emitter 204 versus the rest of the output surface 203.

According to an aspect of the present disclosure, silicon substrate 201 can comprise monocrystalline silicon (i.e., a single crystal of silicon) that is p-type doped with a doping level less than about $10^{19}$ cm$^{-3}$ (i.e., a resistivity of about 0.005 Ω·cm or higher). Since minority carrier lifetime and diffusion length decrease with increasing dopant concentration, dopant concentrations higher than about $10^{19}$ cm$^{-3}$ may be used when the silicon is very thin, such as thinner than about 1 μm, whereas when the silicon is thicker than about 1 μm, dopant concentrations lower than about $10^{19}$ cm$^{-3}$ may be preferred. For silicon that is thicker than a few microns, such as a thickness of 10 μm or more, much lower dopant concentrations, such as less than about $10^{14}$ cm$^{-3}$, may be preferred to ensure long carrier lifetime and low dark current. Since electrons are a minority carrier in p-type doped silicon, one embodiment using p-type silicon includes an optional light source 212 to shine light 214 onto the field emitter to create electron-hole pairs within the silicon. Light source 212 preferably comprises a high-intensity light source such as a laser diode or a high brightness LED, preferably having a bandwidth of about 20 nm or less. Light source 212 may be placed behind the emitter 204 opposite the front side with the emitter 204 to illuminate a back side as shown or may illuminate the emitter 204 from the top side opposite this back side. When the light source 212 is placed below the emitter 204 as shown, light source 212 can emit a light wavelength that penetrates relatively deep into the silicon, such as a wavelength longer than about 500 nm, in order to create electron-hole pairs away from the bottom surface of the silicon. When light source 212 illuminates the field emitter 204 from the top side, a shorter wavelength that penetrates more shallowly into silicon, such as a wavelength shorter than about 450 nm, may be preferred in order to create electron-hole pairs relatively close to the field emitter 204. The light source 212 may be configured to maintain a desired emission current from the field emitter, such as by controlling the current flowing in the light source.

In an alternative embodiment, the silicon may be n-type doped with a dopant concentration of about $10^{16}$ cm$^{-3}$ or greater. For example, the silicon may be n-type doped with a dopant concentration between about $10^{16}$ cm$^{-3}$ and $10^{19}$ cm$^{-3}$. Silicon with n-type doping has many electrons available in the conduction band, which may be drawn toward the tip of the field emitter 204 to form the emission current. When using n-type doped silicon, the emission current may be controlled by adjusting a voltage on a gate electrode (such as an electrode within the extraction and focusing electrodes 102 in FIG. 1, or gate 307 in FIG. 3) or by adjusting the voltage difference between the anode and the field emitter. When n-type doped silicon is used, the optional light source 212 may be omitted.

Figure 2B:
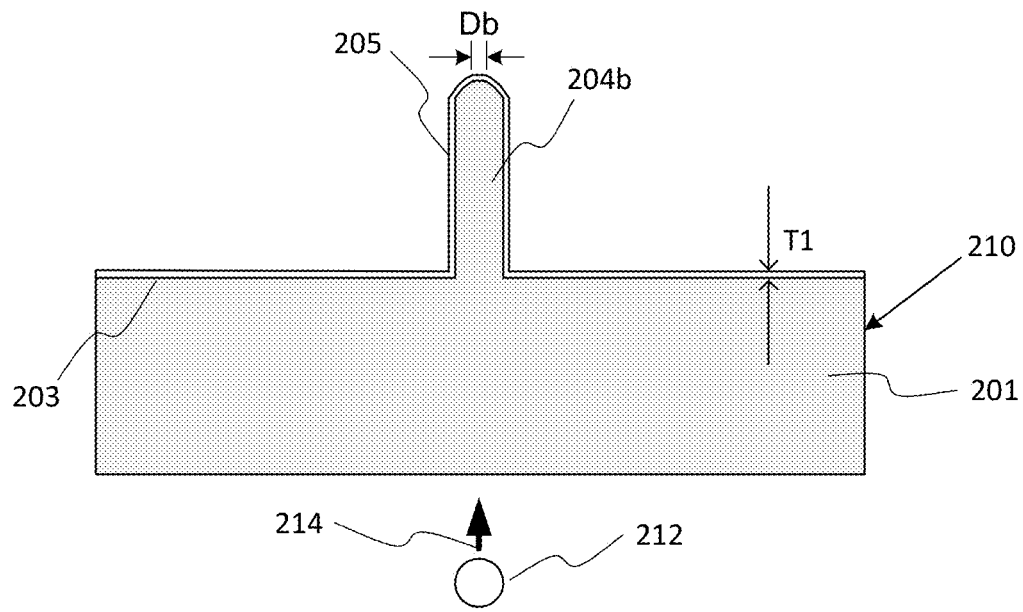

According to another aspect of the present disclosure, the field emitter 204 may take various geometrical forms such as rounded whiskers, rounded cones, or pyramids. FIG. 2(B) illustrates an electron source 200b comprising a rounded whisker emitter 204b. Rounded whiskers, or rounded cones with an approximately zero-degree half angle, provide a higher field enhancement in comparison with rounded cones or pyramid, with a half angle much greater than zero degrees. However, rounded whiskers are worse heat conductors than rounded cones or pyramids of a similar height. Thus, there is usually a trade-off between field enhancement and thermal stability. The field emitter 204b (or 204) may extend from a surface of the substrate 201 by less than 10 μm or by less than 20 μm. Other than the shape of the field emitter structure, electron source 200b may be similarly configured as the various embodiments of electron source 200a described above. Corresponding features that may be similarly configured are labeled with the same labels as in FIG. 2(A) and will not be described in detail again to avoid unnecessary repetition. The apex of rounded whisker 204b may comprise, at atomic scale lengths, a substantially flat area, such as a surface substantially parallel to a crystal plane of the silicon crystal, for example substantially parallel to a (100) plane. In FIG. 2(B) a characteristic lateral dimension, such as a diameter, of the sharpened region is indicated by Db. In a preferred embodiment Db may be between about 1 nm and about 100 nm. For example, Db may be less than about 100 nm. Similar to electron source 200a, electron source 200b may comprise p-type or n-type doped silicon and may include an optional light source 212.

According to another aspect of the present disclosure, the field emitter 204 can be fabricated by standard CMOS fabrication techniques. Silicon dioxide or silicon nitride can be used as a mask material and deposited by, for example, PECVD, and photolithography can be used for patterning. Dry etching (such as RIE, ICP and ECR), wet etching, or a combination of dry and wet etching can be used to form the field emitter. Oxidation sharpening, which is usually performed at low to moderate temperature (e.g., less than about 950° C.), may be used prior to depositing boron layer 205 when sharp field emitter tips are desired.

According to another aspect of the present disclosure, the field emitter may be configured to operate in reverse bias mode as in a p-n diode, in which a depletion layer is generated due to the high electric field at the emitter surface. The interface between vacuum and a boron-coated, p-type doped field emitter can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of the emitter tip, and an electric current, on the order of nA to μA, is produced. Field emission takes place when the applied electric field is high enough to reduce the potential barrier on the silicon-vacuum interface so that the electron can tunnel through this barrier (quantum-mechanical tunneling). The emission current density can be estimated by a modified version of the Fowler-Nordheim theory, which takes into account the field enhancement factor due to the field emitter.

According to another aspect of the present disclosure, boron layer 205 comprises essentially pure boron that is disposed directly on the output surface of the field emitter. As used herein, the phrase "directly on" in conjunction with the boron-to-silicon interface is intended to mean that there are no continuous intervening layers (e.g., oxide or SiNT) layers) separating output surface 204 or 204b of the field emitter and boron layer 205 other than a possible thin layer (i.e., a few monolayers) of $SiB_x$ that may form at the Si/B interface. Note also that the phrase "directly on" does not preclude the presence of a small amount of oxide between some portions of the boron and silicon. Boron layer 205 is grown on clean silicon at a high temperature (i.e., at a temperature higher than approximately 500° C., such as between about 600° C. and 800° C.) using known techniques such that the boron forms a pin-hole free coating on at least the field emitter 204 having a thickness T1 in the range of approximately 2 nm to 6 nm, such as approximately 2 to 4 nm, including all ranges and values to the 0.1 nm therebetween. Other sections of the coating may include pin-hole defects outside of the coating on the field emitter 204 or the coating may be entirely pin-hole free. In an instance, presence of pin-hole defects are minimized outside of the field emitter 204.

All native oxide may be removed from the silicon by, for example, a wet clean followed by an in-situ thermal hydrogen clean prior to depositing the boron. Lower temperature deposition of boron is also possible, though the coating may be less uniform, and a coating thicker than 2 nm may be needed to ensure that it is pin-hole free. An advantage of boron layer is that such a pin-hole free coating, when applied to a clean silicon surface, prevents formation of a native oxide on the output surface of the field emitter. As previously described, a silicon dioxide layer has a high band gap and even thin layers can block a significant fraction of electrons from leaving the silicon. Thus, the boron layer 205 allows even electrons with low energies to leave the silicon field emitters 204 and 204b. Formed on the silicon substrate 201, field emitters 204 and 204b circumvent limitations of previous electron emitters and the sharp emitter provides field enhancement and high emission current. In addition, previous silicon devices could not avoid a silicon dioxide interface layer from forming between the silicon and the low work-function material, even if the silicon layer was free of oxide when coated. That is, without an impervious pin-hole-free protection layer on the silicon, oxygen would eventually migrate to the silicon surface and form an oxide layer. An advantage of forming layer 205 using boron is that even a thin pin-hole-free boron layer is impervious to oxygen and hermetically seals the silicon. Since most of the electron emission occurs from a small region near the apex of the field emitter, the lack of pin holes may only be needed within a few hundred nm of the apex of the field emitter. The boron coating well away from the tip, such as on the sides of field emitter 204 or 204b, may be of lower quality than the boron coating at the tip. Another advantage of the boron coating is that the density of defects and interface traps at the silicon to boron interface is typically lower than at the silicon to silicon dioxide interface leading to higher emission current.

Figure 3:
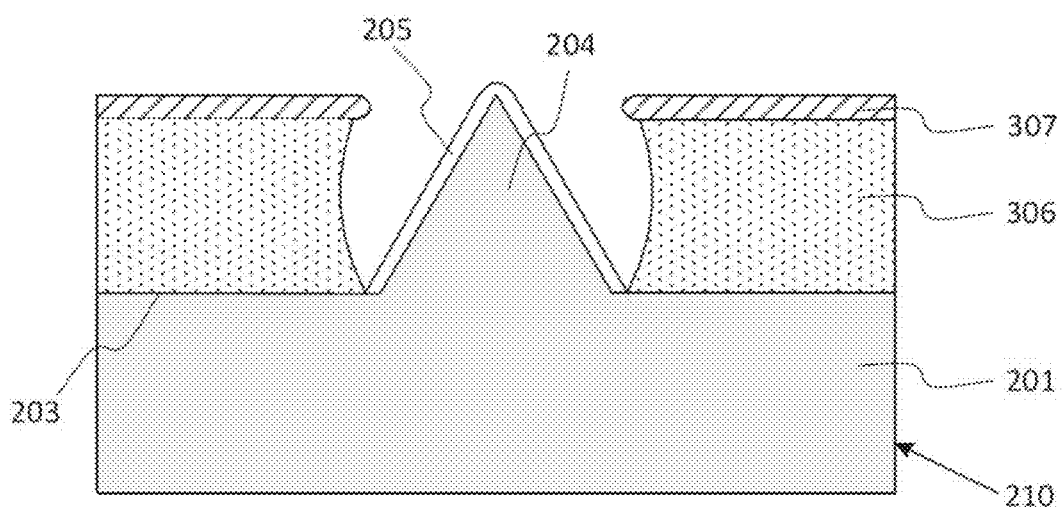
FIG. 3 is a cross-sectional side view illustrating an electron source in the triode configuration including a boron-coated silicon field emitter formed on a silicon substrate and a gate layer according to an alternative embodiment of the present disclosure.

FIG. 3 illustrates, in cross section view, an electron source 300 according to a first alternative embodiment. Similar to the structures described above in FIGS. 2(A) and 2(B), electron source 300 includes a field emitter cathode 210 and an anode (not shown) facing the cathode 210. In the field emitter cathode 210, there is a silicon substrate 201, an upward-facing output (top) surface 203 with a field emitter 204 disposed on output surface 203, and a substantially pure boron layer 205 disposed on the output surface 203 covering the field emitter 204. A second electrode (i.e., the anode (not shown)) is positioned facing the field emitter cathode 210. The anode may be made of a metal such as tungsten, molybdenum, and stainless steel among others. A voltage source is utilized to generate an external potential difference between the cathode and the anode in order to cause electrons to preferentially move toward the emitter tip. Electron source 300 differs from the previously described embodiments in that it includes a gate 307, or control electrode, close to or slightly lower than the height of the field emitter tip and attached to the field emitter by a dielectric layer 306, in order to achieve fast and accurate control of the emission current. Thus, the dielectric layer 306 is approximately equal to or less than the height of the field emitter. Preferably the thickness of dielectric layer 306 differs from the height of the field emitter by no more than about 1 μm. Dielectric layer 306 may comprise one or more dielectric materials, such as $SiO_2$ or $Si_3N_4$. The dielectric layer 306 is disposed on the top surface of the silicon surrounding the field emitter, but does not necessarily cover the field emitter. In another instance, the dielectric layer 306 partly covers the field emitter. The gate 307 or dielectric layer 306 can be fabricated by standard CMOS fabrication techniques such as using PVD, CVD, or ALD deposition methods. The gate 307 may comprise a metal or polysilicon. The simplest emitter design is the triode configuration in which only one gate 307 is used, but other configurations are possible. This gate 307 is typically formed on top of a dielectric layer 306, comprising one or several insulating layers, deposited on the substrate 201. Two or more gate layers (not shown) may be utilized in more complex emitter designs, where multiple dielectric layers are used as spacers in between these gate layers. Note that electron source 300 is not limited to pyramidal or conical field emitters and may comprise any shape field emitter, such as the rounded whisker shaped field emitter 204b illustrated in FIG. 2(B) or another shape. Changes or other configurations from those in FIG. 2(A) are possible in the embodiment of FIG. 3.

While the boron layer 205 is illustrated as only covering the field emitter 204, the boron layer 205 also can extend under the dielectric layer 306. For example, the boron layer 205 may be formed on the substrate 201 and field emitter 204 before formation of the dielectric layer 306.

Figure 4A:
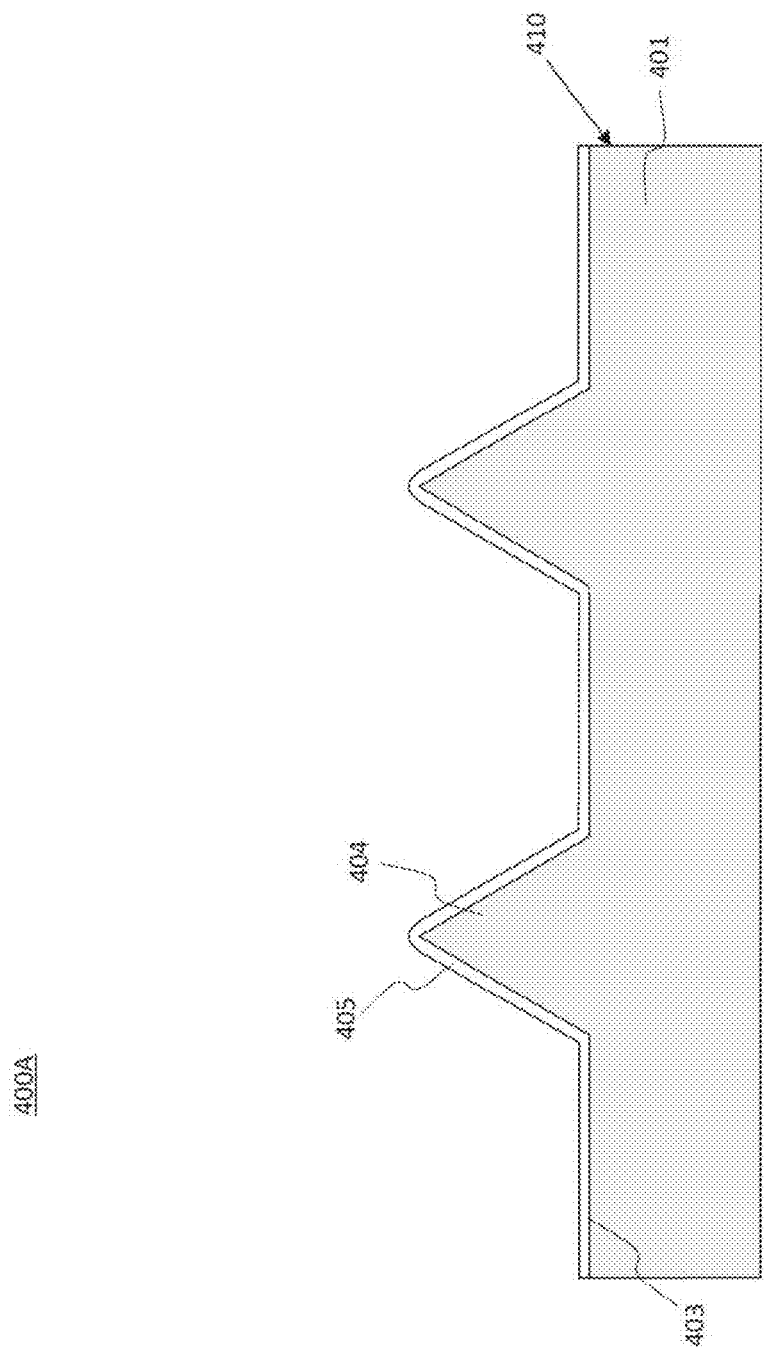
FIG. 4(A) and FIG. 4(B) are cross-sectional side view diagrams illustrating multi electron-beam sources including a boron-coated silicon field emitter array formed on a silicon substrate in the diode and triode configurations according to alternative embodiments of the present disclosure.
Figure 4B:
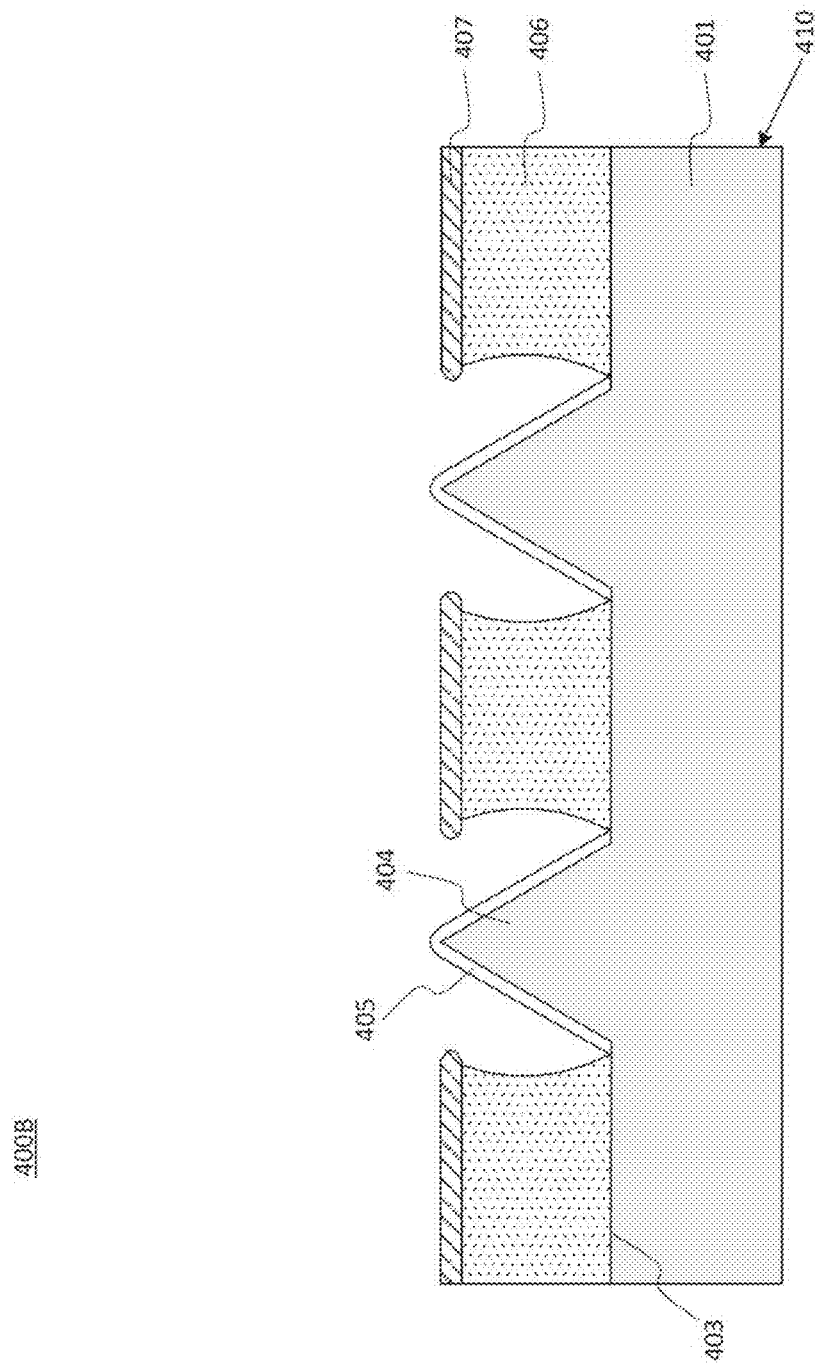

FIGS. 4(A) and 4(B) illustrate, in cross section view, disclosed electron sources according to other alternative embodiments of the present disclosure in which additional layers and structures are utilized to further enhance the beneficial qualities of the disclosed electron source structure. The illustrated exemplary embodiments are not intended to be exhaustive, and electron sources including combinations of the additional layers and structures described below are understood to be possible. The embodiments of FIGS. 4(A) and 4(B) may be similar to the embodiments of FIG. 2(A), 2(B), or 3 in an array. Thus, the boron layer 405 may be similar to the boron layer 205. Note that electron sources 400A and 400B are not limited to pyramidal or conical field emitters may comprise any shape field emitter, such as the rounded whisker shaped field emitter 204b illustrated in FIG. 2(B) or another shape. Changes or other configurations from those in FIG. 2(A), 2(B), or 3 are possible in the embodiments of FIG. 4(A) or 4(B).

FIG. 4(A) illustrates, in cross section view, an electron source 400A according to a second alternative embodiment. Electron source 400A includes a field emitter array (FEA) cathode 410, and an anode (not shown) facing the FEA cathode 410. An FEA typically comprises a plurality of conical, pyramidal, or rounded whisker electron emitters arranged in a two-dimensional periodic array. Any shape of the silicon field emitter that can be used as a single emitter can be replicated as an array.

In the FEA cathode 400A is a silicon substrate 401 having an upward-facing output (top) surface 403 with a plurality of field emitters arranged in a two-dimensional periodic pattern (i.e., the FEA 404 disposed on output surface 403) and a substantially pure boron layer 405 disposed on the output surface 403 covering the FEA 404. The field emitters 404 shown in this figure have a pyramidal shape that can be made by anisotropic etching, which may have a slope angle close to 54.7° since that angle corresponds to the intersection of the (100) and (111) planes in monocrystalline silicon. Oxidation sharpening, which may be performed at a low to moderate temperature (less than about 950° C.), may be used prior to depositing boron layer 405 when sharp field emitter tips are desired. A second electrode (i.e. the anode (not shown)) is positioned facing the field emitter cathode 410. The anode may be made of metals such as tungsten, molybdenum, and stainless steel among others. A voltage source is utilized to generate an external potential difference between the FEA cathode and the anode in order to cause electrons to preferentially move toward the emitter tips. Electron source 400A operates similarly to a typical cold electron source in that, when positioned properly, electrons have a high probability of being emitted, from substrate 401 through the output surface 403 of the FEA, most often from near the tips of the field emitters.

In a manner similar to the field emitters 204 and 204b as described above, the plurality of field emitters 404 can be fabricated by standard CMOS fabrication techniques. Silicon dioxide or silicon nitride can be used as a mask material and deposited by, for example, PECVD, and photolithography can be used for patterning. Dry etching (such as RIE, ICP and ECR), wet etching, or a combination of wet and dry etching can be used to form the field emitters. Oxidation sharpening, which may be performed at a low to moderate temperature (less than about 950° C.), may be used prior to depositing boron layer 405 when sharp field emitter tips are desired.

A parameter influencing the field emitter properties is the spacing between the field emitters. Closely-spaced emitters reduce the field enhancement factor due to screening effects resulting in insufficient electric field penetration between the individual emitters. Hence, to minimize field-shielding effects and to optimize field emission current density, the distance between vertically aligned emitters, or the emitter spacing, can be substantially large, such as on the order of tens of microns to even centimeters. In an instance, the field emitters are spaced from 100 μm to 10 cm apart, including all ranges and values to the 1 μm therebetween. For example, the field emitters may be spaced 10 μm, 50 μm, 100 μm, 200 μm, or 500 μm apart. The spacing of the emitters may be at least 3 times the height of an emitter. Generally, the spacing of the emitters matches the electron optics of the system that they are incorporated into. For that reason, a spacing between 100 μm and several cm might be chosen.

FIG. 4(B) illustrates, in cross section view, an electron source 400B according to a third alternative embodiment. Similar to the structure described above, electron source 400B includes a field emitter array (FEA) cathode 410, and an anode (not shown) facing the FEA cathode 410. In electron source 400B, each individual emitter may be similar to emitter 300 described above and may be similarly configured. In the FEA, electron source 400B comprises a silicon substrate 401 having an upward-facing output (top) surface 403 with a plurality of field emitters arranged in a two-dimensional periodic pattern (i.e., the FEA 404 disposed on output surface 403) and a substantially pure boron layer 405 disposed on the output surface 403 covering the FEA 404. A second electrode (i.e., the anode (not shown)) is positioned facing the field emitter cathode 410. The anode may be made of metals such as tungsten, molybdenum, and stainless steel among others. A voltage source is utilized to generate an external potential difference between the FEA cathode and the anode in order to cause electrons to preferentially move toward the emitter tips. Electron source 400B differs from the previously described embodiment in that it includes a gate 407, or control electrode, close to or slightly lower than the height of the field emitter tips and attached to the field emitters by a dielectric 406, in order to achieve fast and accurate control of the emission current. The dielectric layer 406 is disposed on the top surface of the silicon surrounding the field emitters, but does not necessarily cover the field emitters. In another instance, the dielectric layer 406 partly covers one or more of the field emitters. The gate 407 or dielectric layer 406 can be fabricated by standard CMOS fabrication techniques such as using PVD, CVD, or ALD deposition methods. The gate 407 may comprise a metal or polysilicon. The simplest emitter design is the triode configuration in which only one gate layer is used, but other configurations are possible. This gate 407 is typically formed on top of an insulating layer (dielectric 406), which is usually an oxide layer, deposited on the substrate. Two or more gate layers are utilized in more complex emitter designs (not shown), where insulating layers form spacers in between these gate layers.

Figure 5:
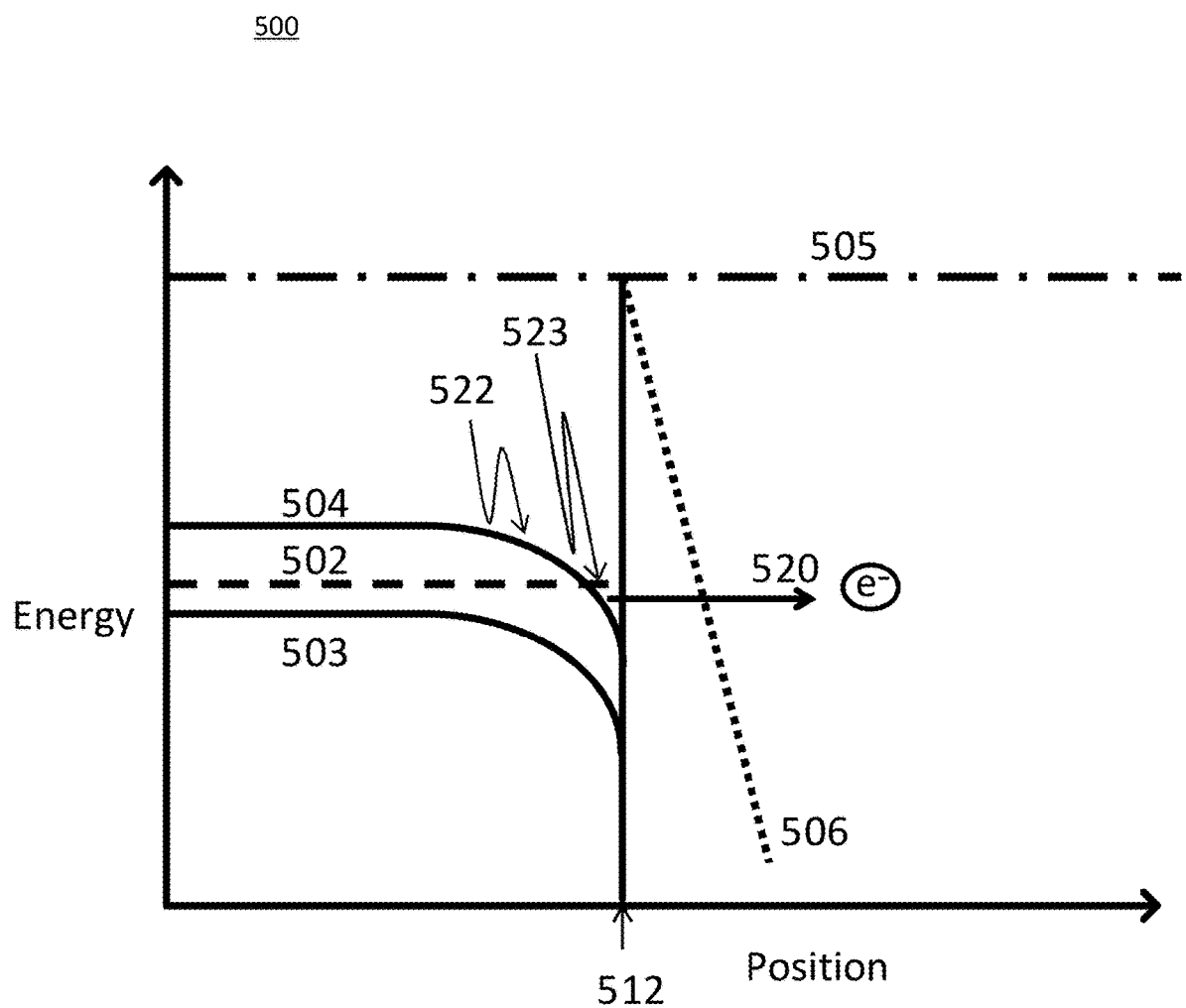
FIG. 5 is an energy diagram illustrating exemplary electron energy levels inside the silicon substrate of an electron source formed in accordance with the present disclosure.
Figure 6:
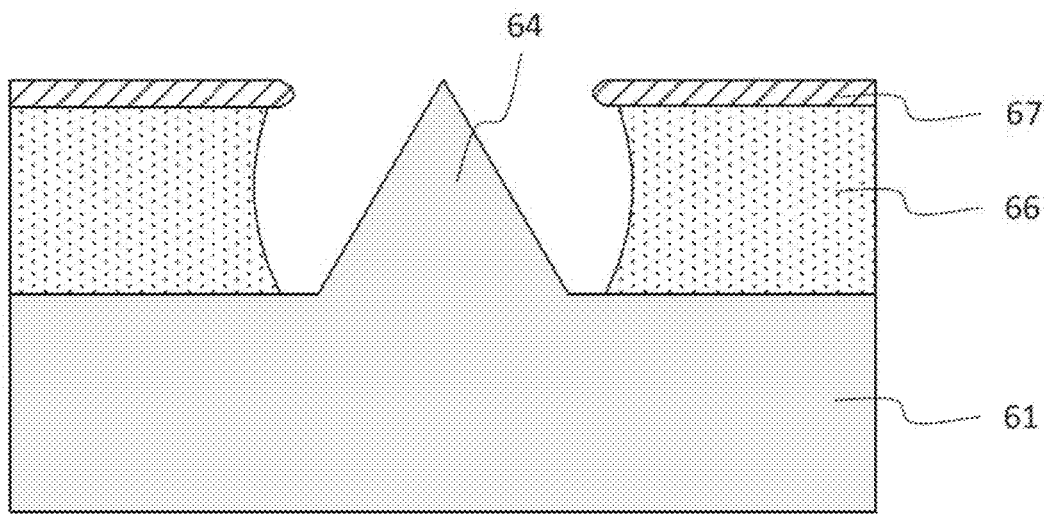
FIG. 6 is a cross-sectional side view illustrating a typical electron source comprising a silicon field emitter.

FIG. 5 is an exemplary energy diagram illustrating electron field emission of an exemplary disclosed electron source structure formed in accordance with the embodiments described above. The vertical direction represents energy. The horizontal direction represents position relative to a field emitter tip surface. The field emitter tip surface position is indicated by label 512, locations within the field emitter are shown to the left of label 512, and locations outside the tip (i.e., the vacuum region) are shown to the right of label 512. Note that this figure is not to scale, is distorted, and some aspects are exaggerated in order to more clearly illustrate key aspects of the electron source. Dashed line 502 represents the Fermi level within the field emitter near its tip under conditions where only a small current is flowing through the tip. Line 503 represents the top of the valence band within the semiconductor. Line 504 represents the bottom of the conduction band. The difference between the bottom of the conduction band and the top of the valence band is called the band gap. For silicon, the band gap is approximately 1.1 eV, but is reduced where the dopant concentration is high. Dot-dashed line 505 represents the vacuum energy level. Dashed line 506 in the vacuum region represents the potential distribution just outside of the tip of the field emitter caused by a relative positive potential applied to an anode (not shown) located at a distance, such as a distance greater than about 1 μm from the tip.

The tip of the field emitter is heavily p doped, either from explicit doping, from diffusion of boron from a surface boron coating (not shown because it is only a few nm thick), or from a combination of the two. Because of the heavy p-type doping near the surface, without an externally applied field, the Fermi level would be just above the top of the valence band causing the bands to bend up close to the surface. However, the applied electric field from the anode will penetrate into the silicon near the tip causing the conduction and valence bands to bend down toward the tip as indicated by arrow 522.

Field emission from silicon field emitters can be described by the well-known Fowler-Nordheim tunneling. The local field at an emitter tip is enhanced by a field enhancement factor compared with the applied electric field. As the external electric field penetrates into the semiconductor, the carrier concentration in the near-surface region changes, and both the conduction band 504 and valence band 503 bend at the emitter surface as indicated by arrow 522.

If the conduction band is bent sufficiently to bring the bottom of the conduction band 504 below the Fermi level 502, electrons collect in the dip as depicted at 523. The highest filled level of the collection coincides with the Fermi level 502, which remains approximately constant throughout the semiconductor when no, or only a small, current is flowing. The large external field accelerates electrons as they move toward the field emitter cathode surface 512 and allows them to reach surface 512 with enough energy to have a high probability of escaping as illustrated by the arrow 520.

For a high electrostatic bias field such as $10^7$ V cm$^{-1}$, the conduction band of a p-type field emitter will be degenerate at the surface, and a depletion region, in which the Fermi level 502 lies in the middle of the energy gap, will be created between the p-type interior and the n-type surface. This leads to a minimum concentration of electrons and holes in such region, similar to the case of a reverse-biased p-n junction.

When the cathode comprises n-type silicon, or when a cathode comprising p-type silicon is operated as a photocathode, the applied electrostatic field need only be strong enough to bend the conduction and valence bands down at the tip, and does not need to bend the conduction band below the Fermi level. With such an applied electrostatic field, few electrons will be generated spontaneously and most of the emission current will come from electrons injected into the region near the tip from the n-type silicon or from electron-hole pairs created by absorption of light.

In previous silicon field emitters, there would be, at least, a thin oxide layer on the silicon surface. This oxide, even if only about 2 nm thick, represents a substantial barrier to any electrons trying to escape. The band gap of silicon dioxide is approximately 9 eV. Such a large band gap results in a local peak in the conduction band within the oxide that is several eVs higher than the conduction band within the silicon. The boron layer on the disclosed field emitter surface blocks oxygen or water from reaching the silicon surface and prevents growth of an oxide layer, thus enabling an efficient electron source.

In one embodiment this silicon field emitter is operated at a temperature close to room temperature to minimize the energy spread of the emitted electrons. In another embodiment, useful when a larger energy spread can be tolerated, the silicon field emitter is operated at an elevated temperature, such as a temperature between about 400K and about 1000K, in order to reduce contamination adhering to the surface of the field emitter and allow operation of the silicon field emitter in a less clean vacuum environment.

Various modifications to the described embodiments will be apparent to those with skill in the art, and the general principles defined herein may be applied to other embodiments. For example, additional electrodes may be placed close to the electron emitter to control the emission, and/or to focus and direct the emitted electrons in a specific direction. Although it is expected that that the silicon field emitters disclosed herein will be particularly useful in various kinds of scanning electron microscopes and electron-beam lithography systems, it is also envisioned that these emitters may be useful in other applications where high radiance and/or high current electron emitters are required, such as in a high brightness X-ray generator.

The electron emitters and methods described herein are not intended to be limited to the particular embodiments shown and described, but are to be accorded the widest scope consistent with the principles and novel features herein disclosed.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron source comprising:
   a silicon substrate having a top surface;
   at least one field emitter formed directly on the top surface of the silicon substrate, wherein the field emitter comprises one of a pyramid, a cone, or a rounded whisker; and a boron layer hermetically disposed on the field emitter, wherein the boron layer is greater than 75% boron, and wherein the boron layer covers the field emitter from the silicon substrate to a tip of the field emitter.

2. The electron source of claim 1, wherein the boron layer comprises less than 10% oxygen near an interface between the boron layer and the silicon substrate.

3. The electron source of claim 1, wherein the tip of the field emitter has a lateral dimension less than 100 nm.

4. The electron source of claim 3, wherein the tip of the field emitter has a lateral dimension greater than 20 nm.

5. The electron source of claim 1, wherein the tip of the field emitter has a diameter less than 100 nm.

6. The electron source of claim 1, further comprising an electrode held at a positive voltage of less than 500 V relative to the field emitter at a distance of 2 µm or less from an apex of the field emitter.

7. The electron source of claim 1, wherein the field emitter is p-type doped with a doping level less than about $10^{14}$ cm$^{-3}$.

8. The electron source of claim 7, further comprising a light source that illuminates the field emitter, wherein the light source comprises one of a laser diode or a light emitting diode and wherein the light source is configured to control the current of the primary electron beam.

9. The electron source of claim 1, wherein the boron layer has a thickness from 2 nm to 6 nm.

10. The electron source of claim 1, further comprising:
a dielectric layer disposed on the top surface adjacent to the field emitter; and
a conductive gate disposed on the dielectric layer opposite of the substrate, wherein the thickness of the dielectric layer is approximately equal to or less than a height of the field emitter.

11. The electron source of claim 1, further comprising a plurality of the field emitters arranged in a two-dimensional periodic pattern.

12. The electron source of claim 11, further comprising:
a dielectric layer disposed on the top surface surrounding the plurality of field emitters; and
a conductive gate disposed on the dielectric layer opposite of the substrate, wherein the thickness of the dielectric layer is approximately equal to or less than a height of a field emitter.

13. The electron source of claim 1, wherein a region of the boron layer extending 100 nm from the tip of the field emitter is greater than 90% boron.

14. A device comprising:
an electron source for generating a primary electron beam that is directed toward a sample,
wherein the electron source comprises:
a silicon substrate having a top surface;
at least one field emitter formed directly on the top surface of the silicon substrate, wherein the field emitter comprises a pyramid, a cone, or a rounded whisker; and
a boron layer disposed on the field emitter, wherein the boron layer is greater than 75% boron, and wherein the boron layer covers the field emitter from the silicon substrate to a tip of the field emitter; and
electron optics.

15. The device of claim 14, wherein the device is a scanning electron microscope (SEM), wherein the electron optics are configured to de-magnify and focus the primary electron beam onto the sample, and wherein the device further comprises a detector for detecting at least one of back-scattered electrons and secondary electrons from the sample.

16. The device of claim 14, wherein the electron source further comprises:
a dielectric layer disposed on the top surface adjacent to the field emitter; and
a conductive gate disposed on the dielectric layer opposite of the substrate, wherein the thickness of the dielectric layer is approximately equal to or less than a height of the field emitter.

17. The device of claim 14, wherein the device is an electron-beam lithography system, wherein the electron optics are configured to de-magnify and focus the primary electron beam onto the target, and wherein the device further comprises a modulator for modulating the intensity of the electron beam.

18. The electron source of claim 14, wherein a region of the boron layer extending 100 nm from the tip of the field emitter is greater than 90% boron.

19. The electron source of claim 14, further comprising a light source that illuminates the field emitter, wherein the light source comprises one of a laser diode or a light emitting diode, and wherein the light source is configured to control the current of the primary electron beam.

* * * * *